(12) United States Patent
Narasimhan et al.

(10) Patent No.: US 9,928,889 B1
(45) Date of Patent: Mar. 27, 2018

(54) BITLINE PRECHARGE CONTROL AND TRACKING SCHEME PROVIDING INCREASED MEMORY CYCLE SPEED FOR PSEUDO-DUAL-PORT MEMORIES

(71) Applicant: QUALCOMM Incorporated, San Diego, CA (US)

(72) Inventors: Mukund Narasimhan, Bangalore (IN); Rakesh Kumar Sinha, Bangalore (IN); Sharad Kumar Gupta, Bangalore (IN); Veerabhadra Rao Boda, East Godavari (IN)

(73) Assignee: QUALCOMM Incorporation, San Diego, CA (US)

( * ) Notice: Subject to any disclaimer, the term of this patent is extended or adjusted under 35 U.S.C. 154(b) by 0 days.

(21) Appl. No.: 15/465,239

(22) Filed: Mar. 21, 2017

(51) Int. Cl.
| | | |
|---|---|---|
| *G11C 11/419* | (2006.01) | |
| *G11C 7/12* | (2006.01) | |
| *G11C 7/14* | (2006.01) | |
| *G11C 7/22* | (2006.01) | |
| *G11C 7/06* | (2006.01) | |
| *G06F 1/32* | (2006.01) | |

(52) U.S. Cl.
CPC .............. *G11C 7/12* (2013.01); *G06F 1/3275* (2013.01); *G11C 7/062* (2013.01); *G11C 7/14* (2013.01); *G11C 7/22* (2013.01)

(58) Field of Classification Search
CPC .. G11C 7/22; G11C 7/14; G11C 7/062; G11C 7/12; G06F 1/3275
USPC ...................................... 365/189.02
See application file for complete search history.

(56) References Cited

U.S. PATENT DOCUMENTS

| | | |
|---|---|---|
| 6,882,562 B2 | 4/2005 | Beucler |
| 7,251,193 B2 | 7/2007 | Jung et al. |
| 7,564,738 B2 | 7/2009 | Pelley, III et al. |
| 7,839,713 B1 | 11/2010 | Yu et al. |
| 9,324,416 B2 | 4/2016 | Yoon et al. |
| 2007/0109909 A1* | 5/2007 | Jung .................... G11C 7/1012 365/233.5 |
| 2015/0049563 A1* | 2/2015 | Maiti .................... G11C 5/148 365/194 |
| 2016/0055903 A1* | 2/2016 | Yoon ....................... G11C 7/222 365/154 |

* cited by examiner

*Primary Examiner* — Pho M Luu
*Assistant Examiner* — Xiaochun L Chen
(74) *Attorney, Agent, or Firm* — Haynes and Boone, LLP

(57) ABSTRACT

A write precharge period for a pseudo-dual-port memory is initiated by an edge (rising or falling) of a read precharge signal. The same edge type (rising or falling) of a write precharge signal signals the end of the write precharge period.

30 Claims, 6 Drawing Sheets

BITLINE PRECHARGE CONTROL AND TRACKING SCHEME PROVIDING INCREASED MEMORY CYCLE SPEED FOR PSEUDO-DUAL-PORT MEMORIES

TECHNICAL FIELD

This application relates generally to pseudo dual port memories and more particularly, to a bitline precharge and tracking scheme for pseudo dual port memories.

BACKGROUND

A dual-port static random access memory (SRAM) cell (bitcell) requires at least eight transistors. In contrast, a traditional single-port SRAM bitcell requires only six transistors. As compared to a single-port SRAM cell, a dual-port SRAM cell thus requires two extra access transistors to accommodate the additional port such that single-port SRAMs are substantially more dense than dual-port SRAMs. To maintain the density advantage of single-port SRAMs, "pseudo-dual-port" (PDP) SRAMs have been developed in which the single port of traditional SRAM is time multiplexed to represent separate read and write ports.

Although pseudo-dual-port SRAM has higher density, this improved density comes at the cost of slower operation in that a single clock cycle must accommodate two access cycles (both a read operation and a write operation) to simulate the two ports of actual dual-port SRAM. The resulting multiplexing of the single access port places timing demands on the PDP memory operation that may be better appreciated though a consideration of the PDP waveforms of FIG. 1. A clock signal (clk) pulses high to trigger a read and write operation. To complete the read operation, a word line (WL) is pulsed high. Prior to the pulsing of the word line for the read operation, the bit lines are precharged as controlled by a global active-high precharge signal (bl_pre_global). This global precharge signal is released prior to the pulsing of the word line for the read operation. At approximately the same time, an active-low read multiplexer (readmux) signal is asserted low so that the appropriate bit lines are coupled to the sense amplifier (not illustrated) during the pulsing of the word line for the read operation.

With the read operation completed, the word line is released followed by the release of the read multiplexer signal. The global precharge signal is then pulsed high to the power supply voltage to begin the precharge of the bit lines for the write operation. After the write precharge is completed, the global precharge signal is released, whereupon the write multiplexer (writemux) signal is asserted to couple the appropriate bit lines to the write driver. The word line can then be pulsed high for the write operation. During the write operation, one of the bit lines to the memory-cell-being-written-to is discharged to ground as indicated by the "Bl discharge" designation for the pulsing of the write multiplexer signal. With the write operation completed, both the word line and the write multiplexer signal are released.

The separation (Rd/Wr isolation) between the pulsing of the word line for the read operation and the write operation defines the maximum amount of time that can be taken for the write operation precharge. But since the global precharge signal is the last signal to be asserted following the completion of the read operation and the first signal to be released prior to the pulsing of the word line for the write operation, the pulse width for the pulsing of the global precharge signal for the write operation is narrower than the separation between the pulsing of the word line for the read and write operations. But achieving a narrow pulse width for the global precharge signal is problematic in that the global precharge signal (being a global signal) is carried on a lead or trace that extends across all the bit lines in the array and thus has a substantial parasitic resistance and capacitance (RC) load. This RC loading produces an RC delay when the global precharge signal is pulsed high (producing a rising edge) and produces yet another RC delay when the global precharge signal is released (producing a falling edge). There is thus a 2*RC delay that must be completed during the pulsing of the global precharge signal.

One of the RC delays is modeled by a precharge tracking circuit 200 as shown in FIG. 2. A clock generator 205 responds to the clock signal (clk) by asserting an internal clock signal (iclk) that is received by a signal generator 220. During a read operation, signal generator 220 receives an asserted read signal. Signal generator 220 responds to the assertion of iclk (in conjunction with the assertion of read signal) by asserting the global precharge signal (bl_pre_global) prior to the word line assertion for the read operation. During the word line assertion for the read operation, signal generator 220 also asserts the active-low read multiplexer (readmux) signal by discharging it to ground. Following the release of the word line for the read operation and the read multiplexer signal, clock generator 205 again pulses the internal clock signal high to trigger signal generator 220 to pulse the global precharge signal high to begin the bit line precharge for the write operation. To track one of the RC delays required to pulse the global precharge signal, clock generator 205 charges a dummy word line (dwl) in conjunction with asserting the internal clock signal. The dummy word line has the same electrical characteristics (RC delay) as the actual word line (not illustrated). The charging of the dummy word line then triggers an inverter 215 after the dummy word line charges according to its RC charging delay.

The triggering of inverter 215 causes it to discharge a dummy bit line (Dummy BL load) that has the same electrical characteristics (RC delay) as the actual bit line. The delay through the discharge of the dummy bit line thus models the actual delay required to charge the global precharge signal high and to charge the bit line. But the RC delay is particularly enhanced at the high voltage process corners. So to ensure a sufficient pulse width for the high voltage process corners, a fixed delay circuit 210 adds another delay on top of the RC delay for the dummy bit line assertion and the RC delay for the bit line discharge After the desired delay, fixed delay circuit 210 discharges (or asserts) a reset signal to trigger clock generator 205 to de-assert the internal clock. In response, signal generator 220 discharges the global precharge signal, which requires another RC delay.

The global precharge signal drives an inverter 225 to form an active-low local precharge signal (pre_n) that drives a gate of a PMOS transistor P1 having its drain tied to the bit line (bl) and its source tied to a memory power supply node providing the memory power supply voltage VDD. Thus, once the global precharge signal is charged high, transistor P1 switches on to precharge the bit line to VDD. But despite the modeling performed by tracking circuit 200, it is difficult to ensure that the sufficient pulse width is maintained for all process corners (process, voltage, and temperature). For example, to ensure signal integrity at the high voltage process corners, the modeled delay must be longer than necessary at the low voltage process corners, which lowers the memory operating speed. In addition, the signal loading for the global precharge signal trace that carries the global precharge signal across the columns may be quite different from the word line loading such that the power margin closure for the precharge tracking becomes challenging. In that regard, increasing the number of columns (increasing the array width) increases these precharge tracking problems. This is particularly problematic in that such wide memories are very area efficient as compared to eight-transistor (8T) dual-port register files. It would thus be advantageous to replace such 8T dual-port register files with a corresponding PDP memory except for the performance issues with regard to ensuring a sufficient pulse width for the global precharge signal across all the process corners.

Accordingly, there is a need in the art for improved precharge schemes for PDP memories.

SUMMARY

To provide a shorter write precharge period between the read and write operations, the global precharge signal is replaced by a global read precharge signal and a global write precharge signal. The assertion of the global read precharge signal starts the write precharge period whereas the assertion of the global write precharge signal ends the write charge period. This assertion of the global read precharge signal can be either active-high or active-low. In an active-high embodiment, the global read precharge signal is asserted to the memory power supply voltage VDD to begin the write precharge period for precharging the bit lines. In such an embodiment, the global write precharge signal is also charged to the memory power supply voltage VDD to force the end of the write precharge period. Alternatively, the global read precharge signal is discharged in an active-low embodiment to begin the write precharge period. The global write precharge signal would then be discharged in such an embodiment to signal the end of the write precharge period.

The same edge (rising or falling) that signals the beginning of the write precharge period is thus used to signal the end of the write precharge period. In other words, if a rising edge (charging from ground to the memory power supply voltage VDD) for the global read precharge signal initiates the beginning of the write precharge period, a rising edge for the global write precharge signal commands the end of the write precharge period. Similarly, if a falling edge (discharging from the memory power supply voltage VDD to ground) for the global read precharge signal triggers the beginning of the write precharge period, a falling edge for the global write precharge signal triggers the end of the write precharge period. This use of the same edge to demarcate both the beginning and the end of the write precharge period is quite advantageous as the difference between the times for the two edges is what defines the write precharge period. Although the charging (or discharging) of the global read and write precharge signals involves an RC delay, the difference between the time of one RC delay and of another cancels the two RC delays. The resulting tracking circuit for the write precharge signals thus does not have to model an RC delay using, for example, a dummy word line to track the write precharge period. This is remarkably advantageous as the write precharge period is much shorter as compared to a conventional write precharge period that would have two additional RC delays. The only RC delay that remains for the write precharge period as disclosed herein is the RC delay for the discharging of the dummy bit line. But that RC delay is quite short as compared to the RC delay for a dummy word line. Accordingly, the operating speed for a PDP memory with the disclosed global read and write precharge signals is advantageously increased as compared to a conventional PDP memory that must pulse a global precharge signal during the write precharge period.

These and additional advantages may be better appreciated through the following detailed description.

BRIEF DESCRIPTION OF THE DRAWINGS

These aspects of the disclosure and their advantages are best understood by referring to the detailed description that follows. It should be appreciated that like reference numerals are used to identify like elements illustrated in one or more of the figures.

DETAILED DESCRIPTION

A PDP memory is provided in which the write precharge period is demarcated by a global read precharge signal and a global write precharge signal. An edge (rising or falling) of the global read precharge signal initiates the beginning of the write precharge period. During the write precharge period, the bit lines in the PDP memory for the addressed memory cell are precharged. The same edge used for the global read precharge signal is used by the global write precharge signal to signal the end of the write precharge period. The use of the same edge to signal both the beginning and the end of the write precharge period is quite advantageous. For example, producing a rising edge involves a PMOS transistor switching on to charge the line carrying the global precharge signal (read or write) whereas a falling edge is produced by an NMOS transistor switching on to discharge the line carrying the global precharge signal. Depending upon the process corner, the strength of the PMOS transistor as compared to the NMOS transistor will vary. But such process variations have no impact since the same type of transistor (NMOS or PMOS depending upon the type of edge used) will produce both the edge for the global read precharge signal and for the global write precharge signal.

But it is not just the process variations that are accounted for. More fundamentally, the 2*RC delay required for the pulsing of a conventional global precharge signal is eliminated. In that regard, the line carrying the conventional global precharge signal has a certain RC loading that produces a corresponding RC delay for its charging and for its discharging (ignoring the process variation that will exist between the charging and discharging as discussed above). There is thus an RC delay to charge the conventional global precharge signal and an RC delay to discharge it, which results in a 2*RC delay. But there is no such RC delay at all for the write precharge period defined herein since it is the difference between the time of the edge for the global read precharge signal that begins the write precharge period and the time of the corresponding edge for the global write precharge signal that defines the disclosed write precharge period. Depending upon the process corner, the 2*RC delay for a conventional global precharge signal will vary but typical values may range from 50 ps to as much as 250 ps or more. Such delay is eliminated herein by the advantageous use of the same edge for the global read precharge signal and for the global write precharge signal to demarcate the write precharge period.

Figure 1:
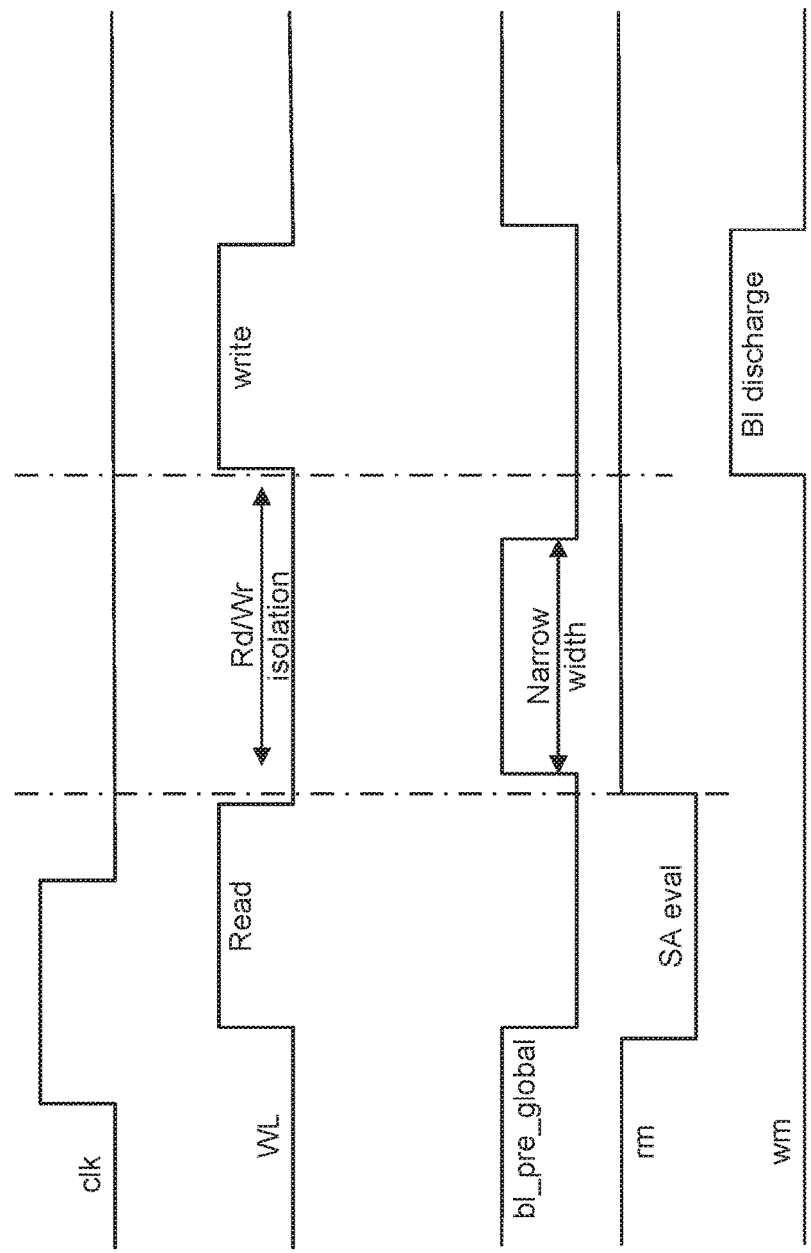
FIG. 1 illustrates a variety of waveforms for a conventional PDP memory.
Figure 3:
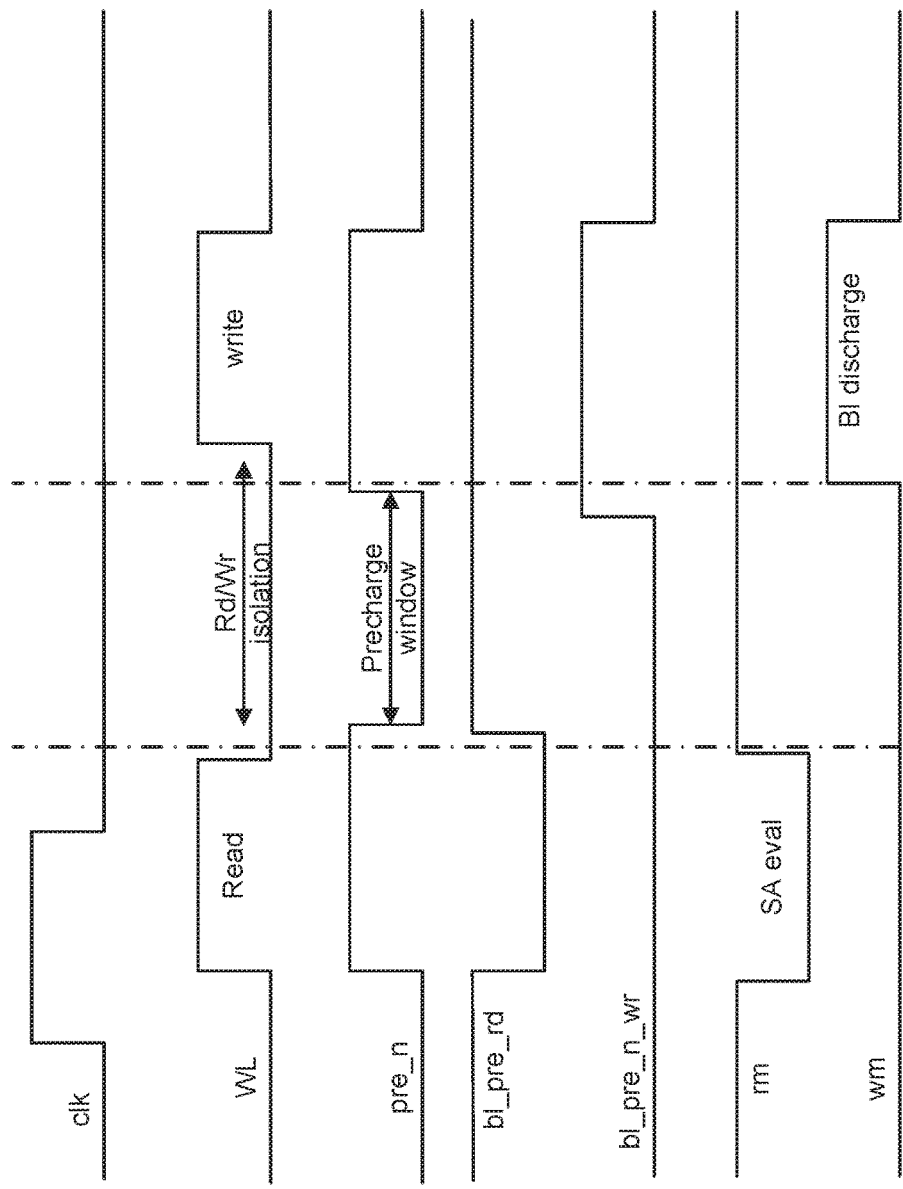
FIG. 3 illustrates a variety of waveforms for a PDP memory in which the write multiplexer signal is not asserted until the write row address is available in accordance with an aspect of the disclosure.

The resulting increase in operating speed may be better appreciated through a consideration of the waveforms for an example PDP memory as shown in FIG. 3. As discussed with regard to FIG. 1, a clock signal (clk) is pulsed to trigger both a read and a write operation as known in the PDP memory arts. Prior to the word line (WL) assertion for the read operation, an active-high global read precharge signal (bl_pre_rd) is already asserted high to the memory power supply voltage VDD to precharge the bit lines for the addressed memory cell (not illustrated). An active-low local precharge signal (pre_n) for the charging of the bit lines is thus low while the global read precharge signal is asserted for the read precharge period. Just prior to the word line assertion for the read operation, the global read precharge signal is discharged such that the local precharge signal goes high to release the bit line precharge. The word line is then asserted to complete the read operation in conjunction with the assertion low of an active-low read multiplexer signal (rm) so that the sense amplifier evaluation (SA eval) of the read operation may be conducted while the word line is high for the read operation. Since the global read precharge signal is active-high, a falling edge for the global read precharge signal signals the end of the read precharge period. The local precharge signal then goes high to stop the precharge for the read operation. But since the read multiplexer signal is active low, it will also have a falling edge to signal the beginning of the sense amplifier evaluation period during which the read multiplexer (not illustrated) selects for the memory cell's bit lines to couple the selected bit lines to the sense amplifier. Such matching of the polarity for the global read precharge signal and the read multiplexer signal is advantageous for accounting for the functional read margin across all the process corners. More generally, if the global read precharge signal were active-low, the read multiplexer signal may be active-high so that the same edge (in this case, a rising edge) would signal the end of the read precharge period and the beginning of the sense amplifier evaluation period for the read operation.

The read multiplexer signal and the word line are both released (de-asserted) at the end of the read operation. Since the global read precharge signal in the PDP memory embodiment shown in FIG. 3 is active-high, the global read precharge signal goes high to signal the beginning of the write precharge period (designated as a precharge window in FIG. 3). This causes the local precharge signal (pre_n) to again go low so as to charge the bit lines during the write precharge period. Recall that the same edge that is used to demarcate the beginning of the write precharge period is also used to demarcate the end of the write precharge period. Since the global read precharge signal in FIG. 3 is active-high, it has a rising edge to signal the beginning of the write precharge period. The global write precharge signal (bl_pre_n_wr) will thus have a rising edge to signal the end of the write precharge period. The local precharge signal pre_n thus goes high prior to the assertion of the word line for the write operation to stop the bit line precharging. Shortly thereafter, the write multiplexer (writemux) signal is asserted to couple the write driver to the bit lines for the selected memory cell for the write operation. It is advantageous to use the same polarity (in this case a rising edge) for the write multiplexer signal to trigger the write multiplexer as was used by the global write precharge signal to signal the end of the write precharge period. In this fashion, a power margin between the bit line precharge and the bit line discharge for the write operation is avoided across all process corners.

With the write multiplexer signal and the word line asserted, the appropriate bit line is discharged (BL discharge), which depends upon the binary value being written in the current write operation. The word line may then be asserted to complete the write operation. Note that the assertion of the global write precharge signal to trigger the end of the write precharge period occurs responsive to a tracking circuit such as a tracking circuit 400 shown in FIG. 4. A clock (Clk) generator 205 is configured to respond to the assertion of a system clock (clk) signal to begin charging a dummy word line (dwl) when the global read precharge signal is asserted to begin the write precharge period. But note that only the capacitance of the dummy word line loads an inverter 410. In contrast, conventional tracking circuit 200 has the RC load from its dummy word line loading inverter 215. In this fashion, conventional tracking circuit 200 accounts for the RC delay of charging the global precharge signal. But there is no such RC delay for the write precharge period disclosed herein because it is defined by the difference between the two edges of the global read and write precharge signals. Indeed, the dummy word line may be entirely eliminated for alternative embodiments of tracking circuit 400. Its inclusion, however, allows tracking circuit 400 to track the skew for the charging of the global read precharge signal across the various process corners.

Once the capacitance of the dummy word line is sufficiently charged, its rising voltage will trigger inverter 410 to discharge a dummy bit line (Dummy BL load). This requires some RC delay but this RC delay is typically quite small as compared to the loading of the global precharge signals. In general, the RC delay for the bit line discharge will depend upon the process corner but some typical values range from approximately 20 ps to 60 ps. In contrast, the 2*RC delay for the conventional global precharge signal pulsing is much more substantial such as 50 ps to as much as 250 ps or more as discussed earlier. The resulting write precharge period using the separate global precharge signals disclosed herein is thus markedly shorter, which enables a corresponding increase in PDP memory operating speed.

Figure 2:
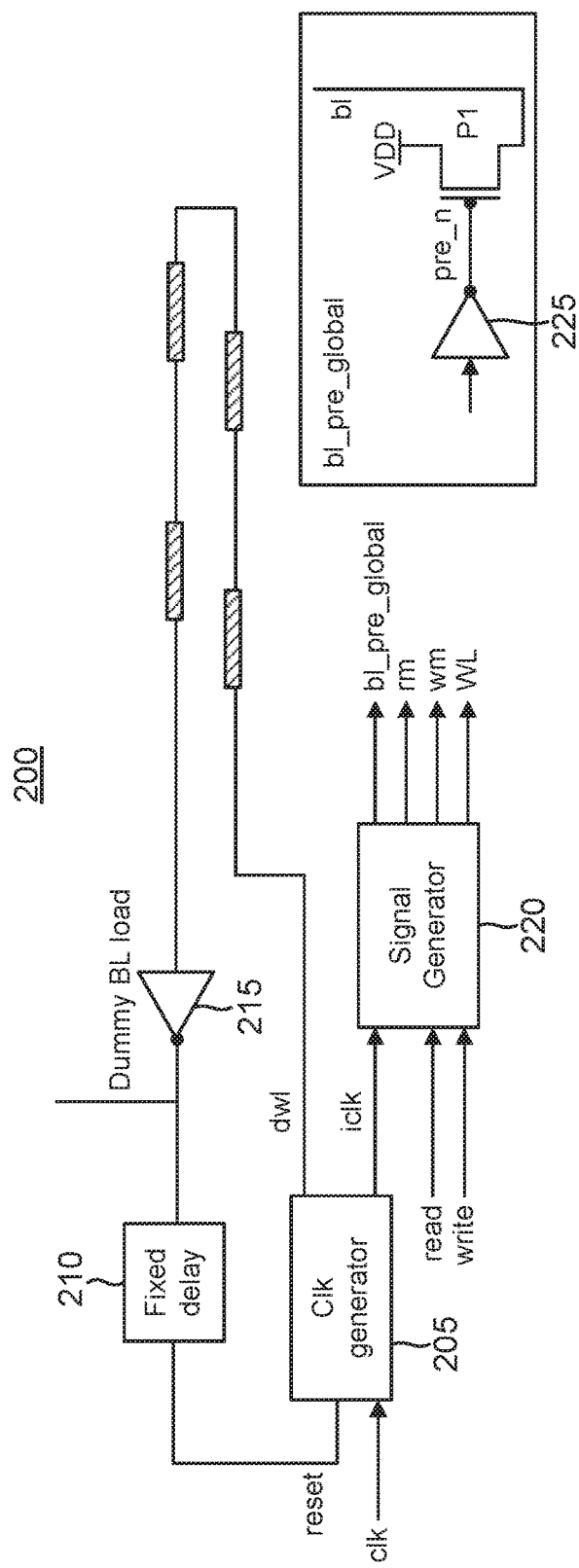
FIG. 2 is a circuit diagram of a write precharge period tracking circuit for the conventional PDP memory of FIG. 1.

A fixed delay circuit 405 adds some additional delay after the dummy bit line discharge such as to account for any increases in the column number, etc., resulting from design changes. But this additional delay is much less than the fixed delay from the analogous delay circuit 210 as discussed with regard to FIG. 2 since there is no need for tracking circuit 400 to account for high voltage process variation of the relatively large RC delay for the dummy word line. After the additional delay from delay circuit 405, clock generator 205 resets the internal clock (iclk) to trigger a signal generator 415 to assert the global write precharge signal to end the write precharge period (the production of both the global write precharge signal and the global read precharge signal by signal generator 415 is represented by the variable "bl_pre" for illustration brevity). In addition to receiving the internal clock, signal generator 415 is also configured to respond to a read signal that is asserted during the read operation and to receive a write signal that is asserted during the write operation so as to produce the corresponding global precharge signal at the appropriate time as triggered by the internal clock. A bit line precharge circuit 425 is configured to respond to the edges of the global read precharge signal and the global write precharge signal to charge a bit line (bl) during the write precharge period.

A logic gate such as a NAND gate 430 in bit line precharge circuit 425 receives the global read precharge signal and an inverted version of the global write precharge signal from an inverter 420 to produce the active-low local precharge signal (pre_n). Note that the global write precharge signal is only asserted high at the end of the precharge window and is then discharged at the end of the write operation. When the global read precharge signal is asserted to start the write precharge period, the output of inverter 420 will thus be high such that NAND gate 430 discharges the local precharge signal in response to the assertion of global read precharge signal. As discussed with regard to tracking circuit 200, the local precharge signal drives a gate of a PMOS transistor P1 that has its source tied to a power supply node supplying the memory power supply voltage VDD. The drain of transistor P1 couples to the bit line so transistor P1 switches on to charge the bit line whenever the local precharge signal is discharged. When the global write precharge signal is asserted to finish the write precharge period, the output of inverter 420 goes low, which forces NAND gate 430 to charge the local precharge signal and switch off transistor P1 to stop the bit line precharge.

Figure 5:
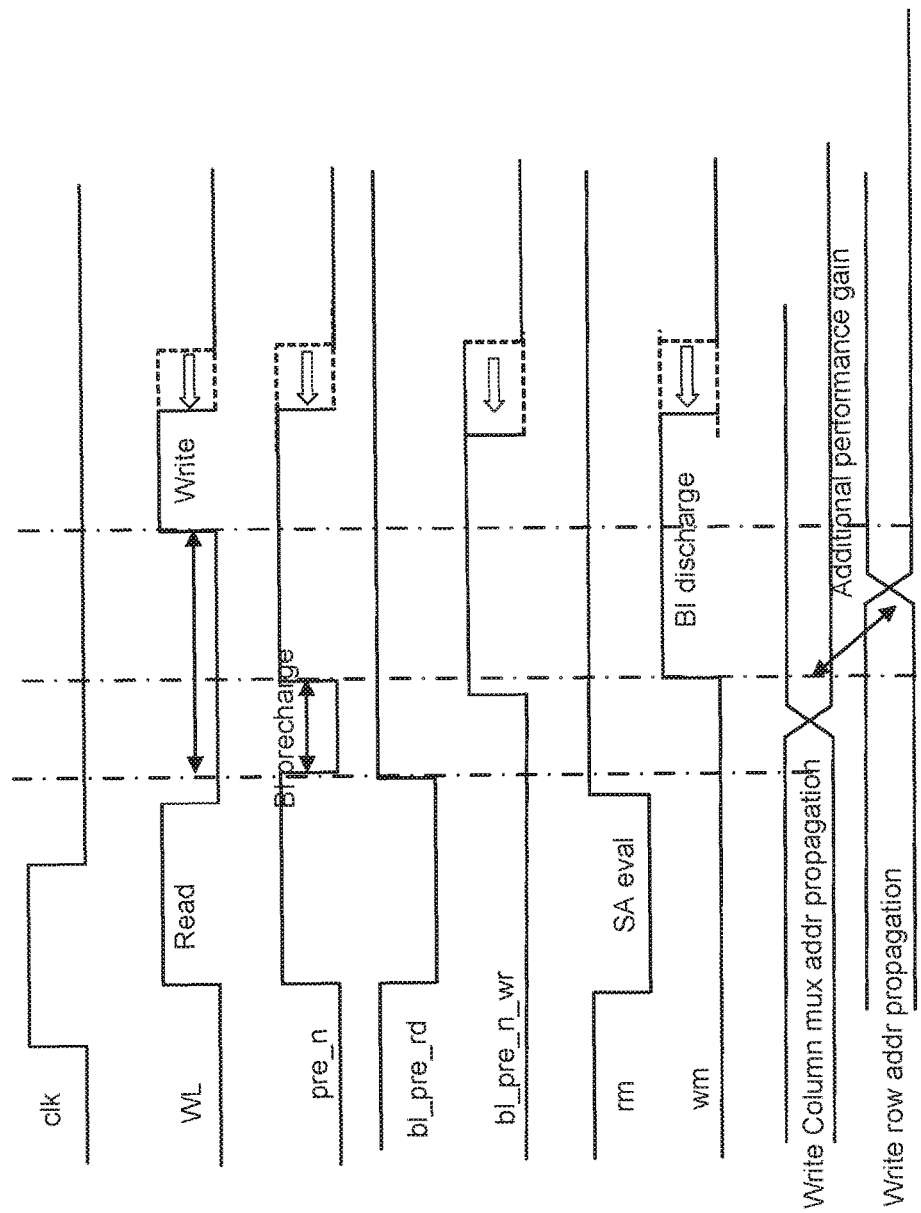
FIG. 5 illustrates a variety of waveforms for a PDP memory in which the write multiplexer signal is asserted before the write row address is available in accordance with an aspect of the disclosure.

The reduction in the write precharge period may be used to even further increase PDP memory operating speed as shown with regard to the waveforms of FIG. 5 for PDP memories in which the address pre-decoder is unclocked. In such PDP memories, the write column address for a write operation is available before the write row address. The bit line discharge can thus begin in what conventionally would still be the write precharge period. In particular, such an advantageously early discharge of the bit line cannot occur in a conventional PDP memory having a pulsed global precharge signal since the write precharge period is so long that the bit line could not be discharged until the row address was already available. There is thus no time that can be borrowed in such a conventional PDP memory from the write precharge period to begin the bit line discharge for the write operation.

With regard to the read operation for FIG. 5, the pulsing of the clock (clk) triggers the read and write operations as is conventional for a PDP memory. The word line (WL), local precharge signal (pre_n), the global read precharge signal (bl_pre_rd), and the read multiplexer (rm) function as discussed with regard to FIG. 3 for the read operation. The write precharge window is also demarcated by the same edge of the global read and write precharge signals as discussed with regard to FIG. 3. But as shown in FIG. 5, the write precharge period is changed by asserting the write multiplexer (wm) signal after the write column address is available (Write Column mux addr propagation) and before the word line for the write operation is asserted. The word line is then asserted after the write row address is available (Write row addr propagation). Since the bit line discharge is thus developed prior to the assertion of the word line through the early assertion of the write multiplexer signal, the word line assertion is shortened as compared to the word line assertion for the write operation in FIG. 3. A similar shortening occurs for the global write precharge signal (bl_pre_n_wr), the local precharge signal (pre_n), and the write multiplexer signal (wm). The PDP memory operation is thus advantageously increased by the bit line discharge prior to the assertion of the word line as enabled through the shortened write precharge period.

Figure 4:
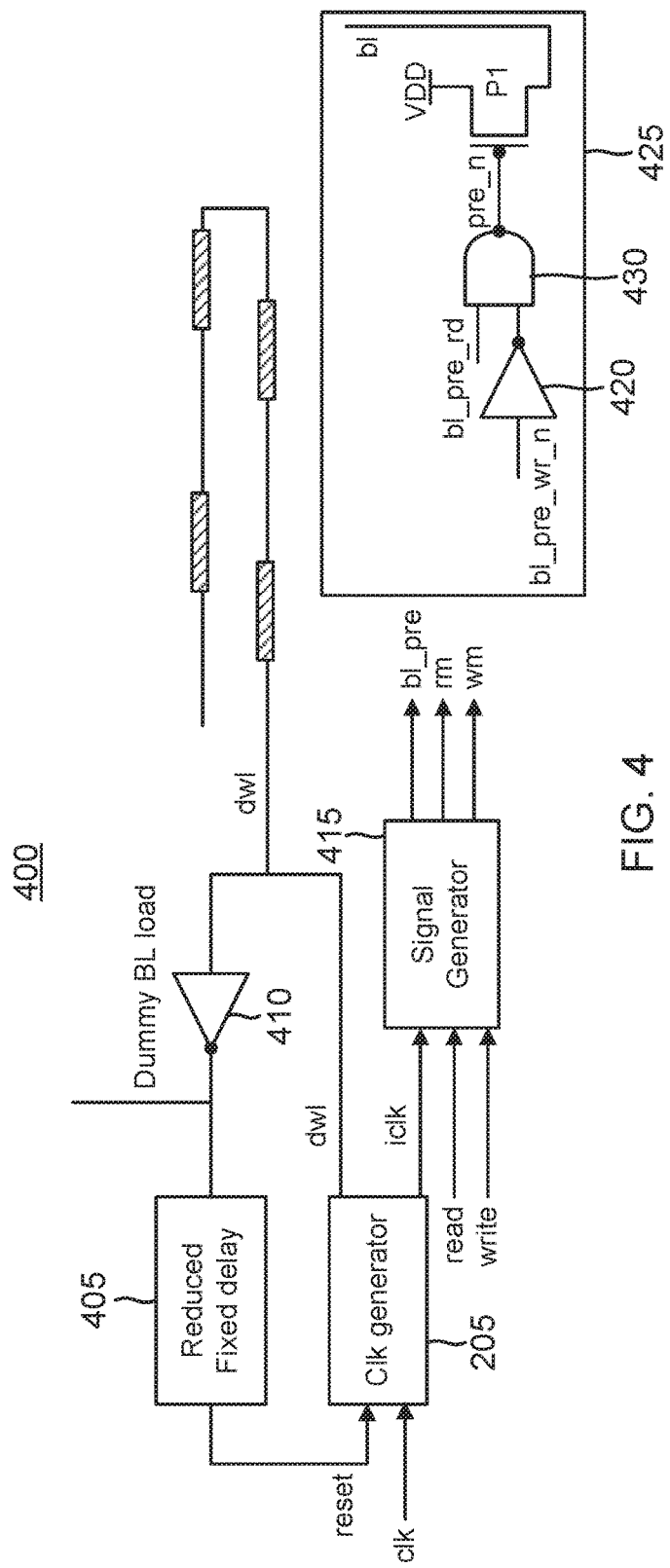
FIG. 4 is a circuit diagram of a tracking circuit for a PDP memory in accordance with an aspect of the disclosure.
Figure 6:
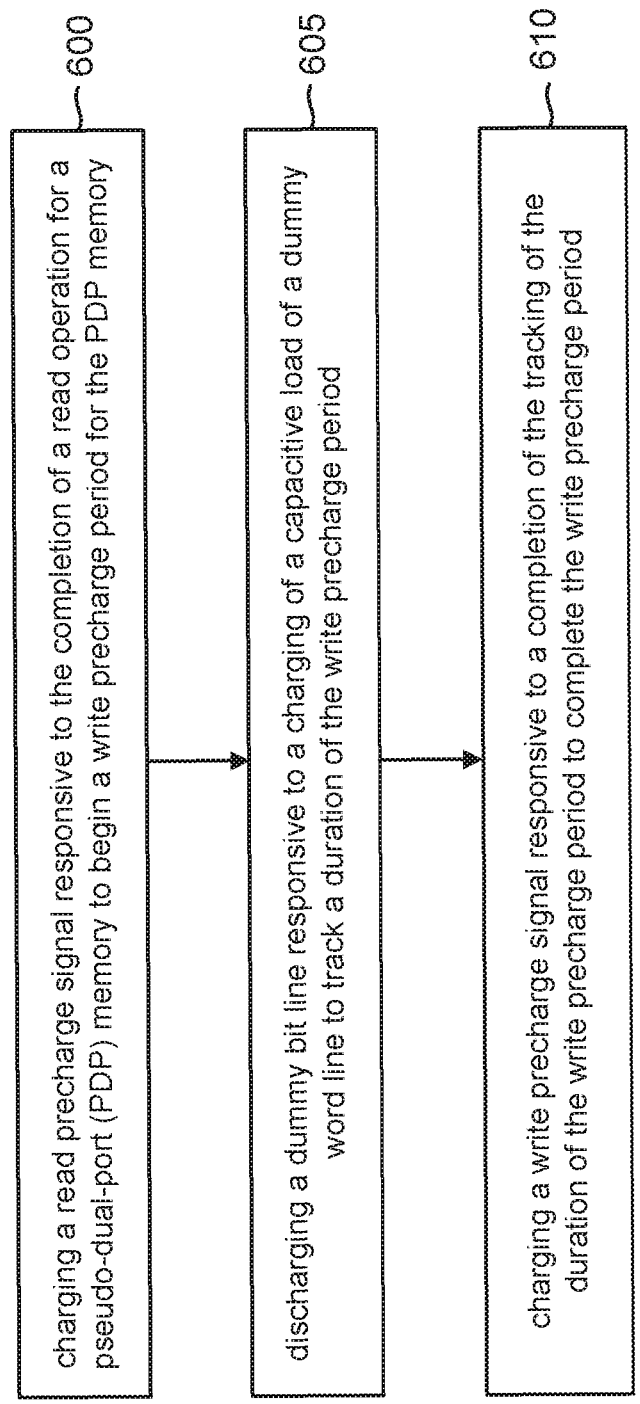
FIG. 6 is a flowchart for a method of tracking a write precharge period in accordance with an aspect of the disclosure.

An example method of operation for the write precharge period of a PDP memory will now be discussed with regard to the flowchart of FIG. 6. The method includes an act 600 of charging a read precharge signal responsive to the completion of a read operation for a pseudo-dual-port (PDP) memory to begin a write precharge period for the PDP memory. An example of act 600 is the charging of the global read precharge signal of FIGS. 3 and 5. In addition, the method includes an act 605 of discharging a dummy bit line responsive to a charging of a capacitive load of a dummy word line to track a duration of the write precharge period. The discharging of the dummy bit line as discussed with regard to FIG. 4 is an example of act 605. Finally, the method includes an act 610 of charging a write precharge signal responsive to a completion of the tracking of the duration of the write precharge period to complete the write precharge period. The charging of the write precharge signal of FIGS. 3 and 5 is an example of act 610.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A pseudo-dual-port (PDP) memory, comprising:
   a tracking circuit configured to discharge a dummy bit line responsive to the charging of a capacitive load for a dummy word line;
   a signal generator configured to charge a read precharge signal responsive to an internal memory clock to begin a write precharge period and to charge a write precharge signal responsive to a completion of the discharging of the dummy bit line; and
   a bit line precharging circuit configured to begin charging a bit line responsive to the charging of the read precharge signal and to stop charging the bit line responsive to the charging of the write precharge signal.

2. The PDP memory of claim 1, further comprising:
   a clock generator configured to trigger the charging of the capacitive load for the dummy word line in the tracking circuit responsive to a cycling of a system clock and to reset the internal memory clock responsive to the discharge of the dummy bit line.

3. The PDP memory of claim 1, further comprising a delay circuit configured to delay an output signal responsive to the discharging of the dummy bit line, wherein the bit line precharging circuit is further configured to begin charging the bit line responsive to the output signal from the delay circuit.

4. The PDP memory of claim 1, wherein the tracking circuit includes an inverter coupled between a first end of the dummy word line and the dummy bit line.

5. The PDP memory of claim 4, further comprising:
   a clock generator configured to drive a second end of the dummy word line to trigger the charging of the capacitive load for the dummy word line in the tracking circuit responsive to a cycling of a system clock.

6. The PDP memory of claim 1, wherein the bit line precharging circuit includes a logic gate configured to process the read precharge signal and an inverted version of the write precharge signal.

7. The PDP memory of claim 6, wherein the logic gate is a NAND gate.

8. The PDP memory of claim 7, further comprising a PMOS transistor having its source coupled to a power supply node configured to supply a power supply voltage and its drain coupled to the bit line, and wherein an output of the NAND gate is coupled to a gate of the PMOS transistor.

9. The PDP memory of claim 1, wherein the signal generator is configured to charge a write multiplexer signal to trigger a write multiplexer to select for the bit line.

10. The PDP memory of claim 9, wherein the signal generator is further configured to charge the write multiplexer signal prior to an assertion of a word line for a write operation.

11. The PDP memory of claim 10, wherein the signal generator is further configured to charge the write multiplexer signal responsive to write column address for the write operation being available prior to a write row address for the write operation.

12. The PDP memory of claim 1, wherein the signal generator is further configured to charge a read multiplexer signal prior to the charging of the read precharge signal.

13. The PDP memory of claim 1, wherein the read precharge signal and the write precharge signal are both global precharge signals.

14. A method, comprising:
charging a read precharge signal responsive to a completion of a read operation for a pseudo-dual-port (PDP) memory to begin a write precharge period for the PDP memory;
discharging a dummy bit line responsive to a charging of a capacitive load of a dummy word line to track a duration of the write precharge period; and
charging a write precharge signal responsive to a completion of the tracking of the duration of the write precharge period to complete the write precharge period.

15. The method of claim 14, further comprising:
delaying an output signal responsive to discharging of the dummy bit line to produce a delayed output signal, wherein charging the write precharge signal is further responsive to the delayed output signal.

16. The method of claim 14, further comprising:
charging a read multiplexer signal to decouple a sense amplifier from the bit line prior to the charging of the read precharge signal.

17. The method of claim 14, further comprising:
charging a write multiplexer signal after the charging of the write precharge signal to couple a write driver to the bit line.

18. The method of claim 17, wherein the charging of the write multiplexer signal is performed prior to an assertion of a word line for a write operation.

19. The method of claim 18, wherein the charging of the write multiplexer signal is responsive to a propagation of a write column address for the write operation.

20. The method of claim 19, wherein the propagation of the write column address occurs before a propagation of a write row address for the write operation.

21. A pseudo-dual-port (PDP) memory, comprising:
a tracking circuit configured to discharge a dummy bit line responsive to the charging of a capacitive load for a dummy word line;
a signal generator configured to discharge a read precharge signal responsive to an internal memory clock to begin a write precharge period and to discharge a write precharge signal responsive to a completion of the discharging of the dummy bit line; and
a bit line precharging circuit configured to begin charging a bit line responsive to the discharging of the read precharge signal and to stop charging the bit line responsive to the discharging of the write precharge signal.

22. The PDP memory of claim 21, wherein the signal generator is further configured to discharge a read multiplexer signal prior to the discharge of the read precharge signal to disconnect a sense amplifier from the bit line upon completion of a read operation.

23. The PDP memory of claim 21, wherein the signal generator is further configured to discharge a write multiplexer signal after the discharge of the write precharge signal to couple the bit line to a write driver for a write operation.

24. The PDP memory of claim 23, wherein the signal generator is further configured to discharge the write multiplexer signal prior to an assertion of a word line for the write operation.

25. The PDP memory of claim 24, wherein the signal generator is further configured to discharge the write multiplexer signal responsive to a propagation of a write column address for the write operation.

26. A method, comprising:
discharging a read precharge signal responsive to a completion of a read operation for a pseudo-dual-port (PDP) memory to begin a write precharge period for the PDP memory;
discharging a dummy bit line responsive to a charging of a capacitive load of a dummy word line to track a duration of the write precharge period; and
discharging a write precharge signal responsive to a completion of the tracking of the duration of the write precharge period to complete the write precharge period.

27. The method of claim 26, further comprising:
discharging a read multiplexer signal prior to the discharging of the read precharge signal to disconnect a sense amplifier from the bit line responsive to the completion of the read operation.

28. The method of claim 26, further comprising:
discharging a write multiplexer signal after the discharging of the write precharge signal to couple a write driver to the bit line for a write operation.

29. The method of claim 28, wherein discharging the write multiplexer signal occurs prior to an assertion of a word line for the write operation.

30. The method of claim 29, wherein the discharging of the write multiplexer signal is responsive to a propagation of a write column address for the write operation.

* * * * *